United States Patent
Maeda

(10) Patent No.: US 10,614,901 B2
(45) Date of Patent: Apr. 7, 2020

(54) MEMORY CONTROLLER, INFORMATION PROCESSING SYSTEM, AND NONVOLATILE-MEMORY DEFECT DETERMINATION METHOD

(71) Applicant: FUJITSU LIMITED, Kawasaki-shi, Kanagawa (JP)

(72) Inventor: Masazumi Maeda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/052,043

(22) Filed: Aug. 1, 2018

(65) Prior Publication Data
US 2019/0057753 A1 Feb. 21, 2019

(30) Foreign Application Priority Data
Aug. 18, 2017 (JP) .................. 2017-157897

(51) Int. Cl.
G11C 16/04 (2006.01)
G11C 16/34 (2006.01)
G11C 16/32 (2006.01)
G11C 16/10 (2006.01)
G11C 29/50 (2006.01)
G11C 29/00 (2006.01)

(52) U.S. Cl.
CPC .......... *G11C 16/3495* (2013.01); *G11C 16/10* (2013.01); *G11C 16/32* (2013.01); *G11C 16/349* (2013.01); *G11C 29/50012* (2013.01); *G11C 29/50016* (2013.01); *G11C 29/70* (2013.01)

(58) Field of Classification Search
CPC ............ G11C 16/3495; G11C 16/3481; G11C 16/3404
USPC .......... 365/185.18, 185.22, 185.24, 200, 201
See application file for complete search history.

(56) References Cited

U.S. PATENT DOCUMENTS

| 2005/0232037 A1* | 10/2005 | Asari .................. G11C 11/5635 365/200 |
| 2007/0136628 A1 | 6/2007 | Doi et al. |
| 2012/0124273 A1* | 5/2012 | Goss ..................... G11C 16/349 711/103 |
| 2012/0163084 A1 | 6/2012 | Franca-Neto et al. |
| 2013/0159785 A1* | 6/2013 | Hashimoto ........... G06F 11/004 714/47.2 |

FOREIGN PATENT DOCUMENTS

| JP | 2008-117500 | 5/2008 |
| JP | 2008-262614 | 10/2008 |
| JP | 2012-133865 | 7/2012 |
| WO | 2007/066523 | 6/2007 |

* cited by examiner

*Primary Examiner* — Connie C Yoha
(74) *Attorney, Agent, or Firm* — Fujitsu Patent Center

(57) ABSTRACT

A memory controller includes a memory that stores therein data corresponding to a distribution of write durations measured from a nonvolatile memory device of a specific model, and a processor that measures a write duration taken to write data to a memory cell in a nonvolatile memory device of a same model as the specific model and that determines whether or not the memory cell is defective by evaluating, based on the data corresponding to the distribution, a displacement of the measured write duration from a center portion of the distribution.

19 Claims, 13 Drawing Sheets

FIG. 12

|  | NUMBER OF CLOCKS |
| --- | --- |
| LOWER THRESHOLD | 95 |
| UPPER THRESHOLD | 205 |

FIG. 13

| COUNT VALUE | NUMBER OF MEMORY CELLS |
|---|---|
| 100 | 7 |
| 101 | 17 |
| 102 | 10 |
| 103 | 7 |
| 104 | 14 |
| 105 | 13 |
| 106 | 6 |
| 107 | 11 |
| 108 | 2 |
| 109 | 5 |
| 110 | 28 |
| 111 | 21 |
| 112 | 21 |
| 113 | 27 |
| 114 | 15 |
| 115 | 20 |
| 116 | 23 |
| 117 | 23 |
| 118 | 18 |
| 119 | 14 |
| 120 | 44 |
| 121 | 49 |
| 122 | 45 |
| 123 | 23 |
| 124 | 33 |
| 125 | 38 |
| 126 | 41 |
| 127 | 43 |
| 128 | 45 |
| 129 | 44 |
| 130 | 43 |
| 131 | 59 |
| 132 | 58 |
| 133 | 50 |
| 134 | 79 |
| 135 | 68 |
| 136 | 69 |
| 137 | 68 |
| 138 | 53 |
| 139 | 70 |
| 140 | 111 |
| 141 | 104 |
| 142 | 122 |
| 143 | 112 |
| 144 | 114 |
| 145 | 142 |
| 146 | 152 |
| 147 | 189 |
| 148 | 175 |
| 149 | 163 |
| 150 | 153 |
| 151 | 149 |
| 152 | 168 |
| 153 | 168 |
| 154 | 146 |
| 155 | 152 |
| 156 | 105 |
| 157 | 111 |
| 158 | 100 |
| 159 | 103 |
| 160 | 116 |
| 161 | 52 |
| 162 | 61 |
| 163 | 71 |
| 164 | 60 |
| 165 | 71 |
| 166 | 52 |
| 167 | 45 |
| 168 | 58 |
| 169 | 63 |
| 170 | 57 |
| 171 | 46 |
| 172 | 47 |
| 173 | 39 |
| 174 | 30 |
| 175 | 45 |
| 176 | 36 |
| 177 | 45 |
| 178 | 33 |
| 179 | 35 |
| 180 | 40 |
| 181 | 19 |
| 182 | 25 |
| 183 | 18 |
| 184 | 27 |
| 185 | 25 |
| 186 | 16 |
| 187 | 16 |
| 188 | 31 |
| 189 | 28 |
| 190 | 16 |
| 191 | 13 |
| 192 | 20 |
| 193 | 9 |
| 194 | 13 |
| 195 | 14 |
| 196 | 9 |
| 197 | 8 |
| 198 | 8 |
| 199 | 9 |
| 200 | 11 |

MEMORY CONTROLLER, INFORMATION PROCESSING SYSTEM, AND NONVOLATILE-MEMORY DEFECT DETERMINATION METHOD

CROSS-REFERENCE TO RELATED APPLICATION

This application is based upon and claims the benefit of priority of the prior Japanese Patent Application No. 2017-157897, filed on Aug. 18, 2017, the entire contents of which are incorporated herein by reference.

FIELD

The embodiments discussed herein are related to a memory controller, an information processing system, and a nonvolatile-memory defect determination method.

BACKGROUND

There are various types of nonvolatile memory, such as flash memories, ferroelectric random-access memories, and magnetoresistive random access memories. The flash memories are broadly classified into NAND flash memories and NOR flash memories. Since the NAND flash memories make it easier to increase the degree of integration because of their structures, the NAND flash memories are used in large-capacity storage devices, typified by solid-state drives (SSDs). On the other hand, the NOR flash memories are used for storing Basic Input/Output Systems (BIOSs), logs, field programmable gate array (FPGA) configuration data, and so on.

In the case of SSDs using NAND flash memories, built-in SSD controllers ensure the reliability during operation. NOR flash memories are mostly used alone, and memory devices having error correction functions are available, but a failure, such as logic inversion, may occur during operation.

In flash memories, a write duration varies greatly from one memory cell to another, for example, owing to the dimension of a control gate, variations in impurity concentration in source and drain regions, a defect during manufacture of a floating gate, an insulating layer, and so on. Thus, in a process of testing for shipment, a write reference voltage is adjusted for each unit of writing (for example, for each bit, word, or block) to converge write durations into a certain range.

However, since the adjustment width of the write reference voltage is limited, there is a certain degree of variations in the write durations after adjusting the write times. With respect to memory cells whose original variations in manufacture are small, the write durations can be adjusted so as to be positioned in the vicinity of a center value (a reference value) of the write durations, which provides memory cells having no problem with memory characteristics.

On the other hand, with respect to memory cells whose original variations in manufacture are significantly large, the write durations are not adjustable so as to fit within a predetermined specified range in which the center value is located, and the memory cells are handled as defective cells. Addresses corresponding to such memory cells may be remedied by performing processing, such as replacing the memory cells with auxiliary memory cells through redundancy processing. When the number of defective cells is large to a degree that the remedy is not possible, the memory device itself is discarded as a defective product.

With respect to a memory cell whose original variations in manufacture are large to a certain degree, not to the above-described degree that the cell in question is handled as a defective cell, the write duration is adjustable so as to fit within the above-described predetermined specified range, but the write duration deviates from the center value significantly. Such a memory cell has a high degree of defectiveness in the memory characteristics and has a possibility that there is a problem with the data retention characteristic. That is, electrical charge accumulated in a floating gate is discharged with time, which may cause loss of stored data.

Even in a memory device including a memory cell having a problem in the data retention characteristic, as described above, when all memory cells fit in the predetermined specified range, a write duration reference in testing for shipment is satisfied, and thus the memory device is shipped from a memory maker as a non-defective product. The problem in the data retention characteristic in such a memory device becomes evident during actual operation after a set maker (a manufacturer that purchases components, such as memory devices, to manufacture products and sell the products to end consumers) build the component into an apparatus. It is problematic for the set maker to be able to notice a failure in the data retention characteristic only after a product into which a potentially problematic memory device is built is shipped to the market.

A technique in which a memory device to which data has been written is placed, for example, in a high temperature state at 125° C. for 24 hours and elapse of a time, for example, one year, in terms of a typical operating state is simulated to detect a potential problem in the data retention characteristic of the memory device is also possible, that is, accelerated screening is also possible. However, even the accelerated screening involves processing in which the high temperature state is continued for 24 hours or more, and taking a large amount of time is a problem.

Hence, it is desirable that a memory cell that is likely to have a problem in the data retention characteristic in a nonvolatile memory be identifiable during writing of actual data.

The followings are reference documents.
[Document 1] Japanese Laid-open Patent Publication No. 2008-262614,
[Document 2] Japanese Laid-open Patent Publication No. 2012-133865,
[Document 3] Japanese Laid-open Patent Publication No. 2008-117500, and
[Document 4] International Publication Pamphlet No. WO2007/066523.

SUMMARY

According to an aspect of the invention, a memory controller includes a memory that stores therein data corresponding to a distribution of write durations measured from a nonvolatile memory device of a specific model, and a processor that measures a write duration taken to write data to a memory cell in a nonvolatile memory device of a same model as the specific model and that determines whether or not the memory cell is defective by evaluating, based on the data corresponding to the distribution, a displacement of the measured write duration from a center portion of the distribution.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a table illustrating an example of the structure of threshold data; and FIG. 13 illustrates an example of histogram data indicating, with respect to each write duration, the number memory cells with which the write duration is taken.

DESCRIPTION OF EMBODIMENT

An embodiment in the present disclosure will be described below in detail with reference to the accompanying drawings. In the accompanying drawings and the following description, the same or corresponding constituent elements are denoted by the same or corresponding reference numbers, and descriptions thereof are omitted as appropriate.

Figure 1:
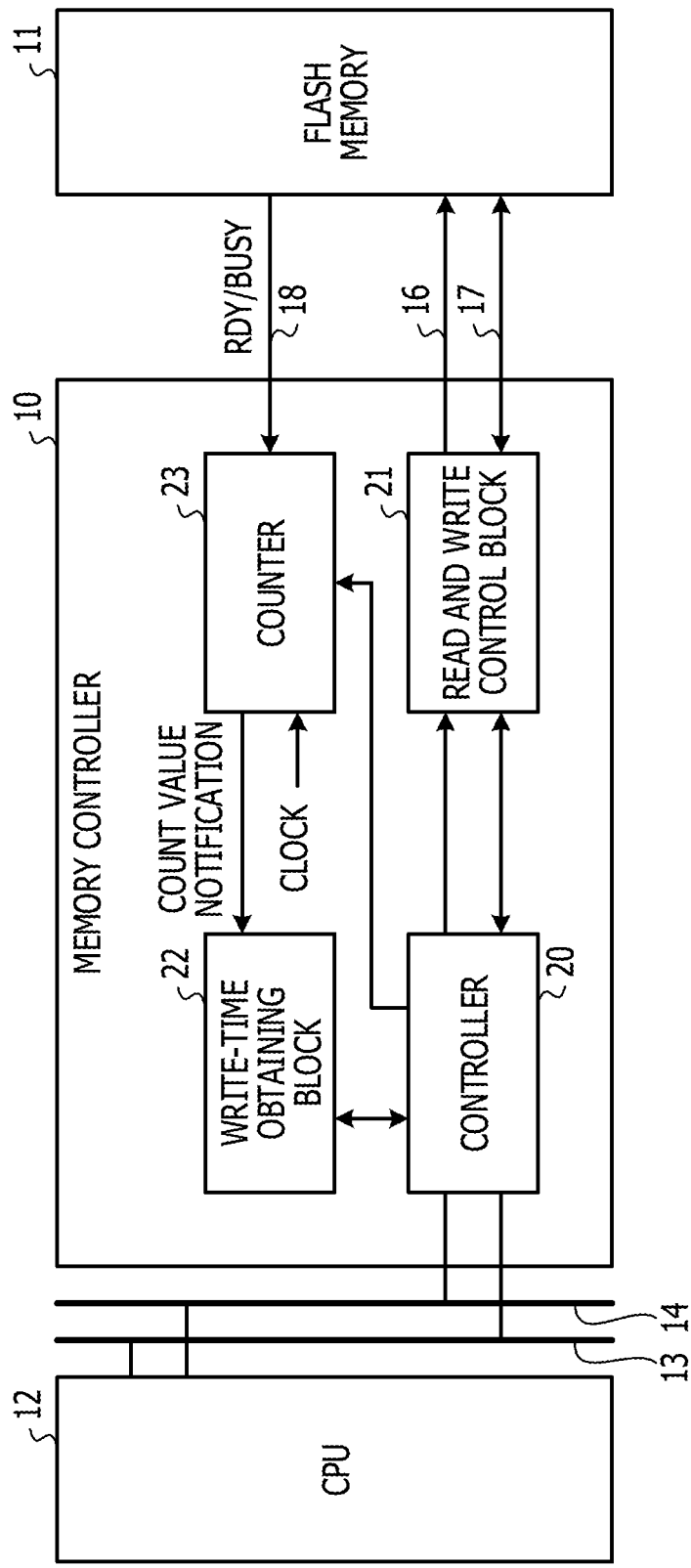
FIG. 1 is a block diagram illustrating an example of the configuration of an information processing system.

FIG. 1 is a block diagram illustrating an example of the configuration of an information processing system. In FIG. 1 and other similar figures, a boundary between each circuit or functional block denoted by a box and another circuit or a functional block basically represents a functional boundary and may or may not correspond to physical position separation, electrical signal separation, control logical separation, or the like. Each circuit or functional block may be one hardware module that is physically separated from another block to some degree or may represent one function in a hardware module physically integrated with another block.

An information processing system illustrated in FIG. 1 includes a memory controller 10, a flash memory 11, and a central processing unit (CPU) 12. The CPU 12 is coupled to the memory controller 10 through an address and command bus 13 and a data bus 14. The memory controller 10 is coupled to the flash memory 11 through an address and command signal line 16, a data signal line 17, and a ready/busy (RDY/BUSY) signal line 18.

The memory controller 10 supplies control signals, such as a chip enable signal, an output enable signal, and a write enable signal, to the flash memory 11 through the address and command signal line 16. The memory controller 10 supplies, to the flash memory 11 through the address and command signal line 16, an address signal indicating an address on which a write operation or a read operation is to be performed. The flash memory 11 operates in accordance with control signals, writes data to a specified address, and read data from a specified address. Data is exchanged between the memory controller 10 and the flash memory 11 through the data signal line 17.

A unit of writing or reading in a single data write operation or data read operation is not limited to a particular number of bits or a particular number of memory cells. Data may be written to or read from one memory cell, for example, data may be written to or read from a plurality of memory cells for one word, or data may be written to or read from a plurality of memory cells for one block.

The flash memory 11 transmits a ready/busy (RDY/BUSY) signal to the memory controller 10 through the ready/busy signal line 18. The ready/busy signal indicates whether or not the flash memory 11 is in a busy state in which a program operation or an erase operation is being performed or in a ready state in which a next operation is executable. When the ready/busy signal is in a first logic state (for example, at a low level), this indicates that the flash memory 11 is in the busy state, and when the ready/busy signal is a second logic state (for example, at a high level), this indicates that the flash memory 11 is in the ready state. After giving a write instruction to the flash memory 11, the memory controller 10 may measure a time taken for a write operation (a time that elapses from start of a write operation until end of the write operation) by monitoring a ready/busy signal from the ready/busy signal line 18.

The memory controller 10 may also measure a time taken for the write operation by referring to a status register in the flash memory 11, rather than monitoring the ready/busy signal. The status register in the flash memory 11 includes a bit indicating whether or not the write operation is being performed. When this bit is in a first logic state (for example, at a low level), this indicates that the flash memory 11 is in the busy state, and when the bit is in a second logic state (for example, at a high level), this indicates that the flash memory 11 is in the ready state. After giving a write instruction to the flash memory 11, the memory controller 10 may measure a time taken for the write operation (a time that elapses from start of the write operation until end of the write operation) by periodically reading and checking the value of the status register. The operations of the information processing system and the memory controller 10 will be described below in conjunction with an example of a case in which a time taken for a write operation is measured by monitoring a ready/busy signal.

The memory controller 10 includes a controller 20, a read and write control block 21, a write-time obtaining block 22, and a counter 23. The controller 20 may be entirely implemented by hardware or may be implemented as a processor that operates based on software (firmware).

The controller 20 receives control signals indicating a write instruction, a read instruction, and so on from the CPU 12 through the address and command bus 13. The controller 20 also receives, from the CPU 12 through the data bus 14, an address signal indicating an address on which a write operation or a read operation is to be performed. The controller 20 decodes an instruction indicated by a control signal and controls the read and write control block 21 in accordance with the result of the decoding. The controller 20 sends write data to the read and write control block 21 and receives read data from the read and write control block 21.

By controlling the write-time obtaining block 22 and the counter 23, the controller 20 measures the duration of writing to a desired address (a write address) in the flash memory 11, based on a ready/busy signal from the ready/busy signal line 18. For example, after resetting the value of the counter 23 to zero, the controller 20 may issue, to the flash memory 11 via the read and write control block 21, an instruction for starting a write operation.

When the ready/busy signal changes from a logic value indicating the ready state to a logic value indicating the busy state, the counter 23 starts a count operation in response to the change. In the count operation, the counter 23 increments its count value by 1 in synchronization with each pulse of a clock signal. The counter 23 continues the count operation while the ready/busy signal has the logic value indicating the busy state. When the ready/busy signal changes from the logic value indicating the busy state to the logic value indicating the ready state, the counter 23 finishes the count operation in response to the change. When the count operation is finished, the counter 23 issues a notification indicating the count value to the write-time obtaining block 22. Upon receiving the notification indicating the count value from the counter 23, the write-time obtaining block 22 stores data indicating the count value in an internal register or the like.

The above-described operation allows the controller 20 in the memory controller 10 to measure a time taken for a write operation on a desired address. The controller 20 may read the data indicating the count value from the write-time obtaining block 22, as appropriate.

A memory in which data corresponding to a distribution of write durations measured from a memory device of a specific model may be disposed inside or outside the memory controller 10. The memory may be, for example, a storage area in a register in the controller 20 or the like or may be a memory device connected to the address and command bus 13 and the data bus 14. The specific model is the same as the model of the flash memory 11.

The distribution of write durations is a histogram indicating the frequency of write durations, that is, a frequency distribution that can be represented by the number of memory cells (memory writing units) with which each write duration is taken. The data corresponding to the distribution of write durations may also be, for example, data indicating the upper limit and the lower limit of permissible write durations, that is, data indicating borders of a predetermined range of write durations. The data corresponding to the distribution of write durations may further include a histogram indicating the frequency of write durations.

As described above, the controller 20 in the memory controller 10 may measure the write duration taken for writing data to memory cells in the flash memory 11 (a memory device of the above-described model). Based on the data corresponding to the distribution of write durations, the controller 20 in the memory controller 10 or the CPU 12 outside the memory controller 10 may determine whether or not any of the memory cells is defective by evaluating a displacement of the measured write duration from the center portion of the distribution. More specifically, when the measured write duration exists outside the predetermined range, the controller 20 or the CPU 12 may determine that any of the memory cells is defective. Making a defect/non-defect determination by using data indicating borders of a predetermined range, as described above, makes it possible to efficiently use a storage area and makes it possible to make a memory-cell defect/non-defect determination by using a simple comparison computational operation.

The term "defective" as used herein does not mean that the memory cell in question is not usable as a storage element. The memory cell has at least a minimum function that holds write data. However, since there is a problem with the data retention characteristic of the memory cell and there is a possibility that data is lost after a long period of time passes, it is determined that the memory cell is defective.

In this case, the write duration taken to write data to the memory cell in the flash memory 11 may be measured during write operation of actual data when the information processing apparatus (illustrated in FIG. 1) into which the flash memory 11 is built is used on site. That is, for example, when the flash memory 11 is used for storing a BIOS, the write duration may be measured when the BIOS is actually stored. Also, for example, when the flash memory 11 is used for storing a log, the write duration may be measured when the log is actually recorded. When the flash memory 11 is used for storing FPGA configuration data, the write duration may be measured when the configuration data is actually stored.

An evaluation is made as to what degree the write duration measured during a write operation of actual data, as described above, varies relative to the pre-determined distribution of write durations, that is, as to what degree the write duration measured during a write operation of actual data is displaced from the center position of the distribution. When the write duration of actual data is greatly displaced from the center of the distribution, a memory cell to which the data is written has a high degree of defectiveness in the memory characteristics and has a possibility that there is a problem with the data retention characteristic. That is, electrical charge accumulated in a floating gate is discharged with time, which may cause loss of stored data. Accordingly, when the write duration of actual data is greatly displaced from the center of the distribution, it may be determined that a memory cell to which the data is written is defective.

When it is determined that a memory cell to which actual data is written is defective, the controller 20 may control the subsequent write operation so that an address of the memory cell is not used. Alternatively, when it is determined that a memory cell to which actual data is to be written is defective, the controller 20 may regard the memory device (the flash memory 11 to which actual data is to be written) as a defective product and may replace the memory device with another memory device of the same model without using that memory device for storing the actual data.

Controlling a subsequent write operation so that an address of a defective memory cell is not used, as described above, is effective for an application with which a memory has a sufficient capacity, an application with which stored data is erasable as appropriate, and so on. For example, when the flash memory 11 is used for storing log information, a technique in which after log information is stored to the fullest memory capacity, the log information is deleted in chronological order with the oldest first, and new log information is stored is conceivable. In such a use, even when operation is performed with some of the addresses in flash memory 11 being made unusable, so much inconvenience does not occur. Controlling a subsequent write operation so that an address of a defective memory cell is not used, as described above, makes it possible to reduce the probability of discarding a memory device as a defective product and makes it possible to use an economically advantageous memory device.

Figure 2:
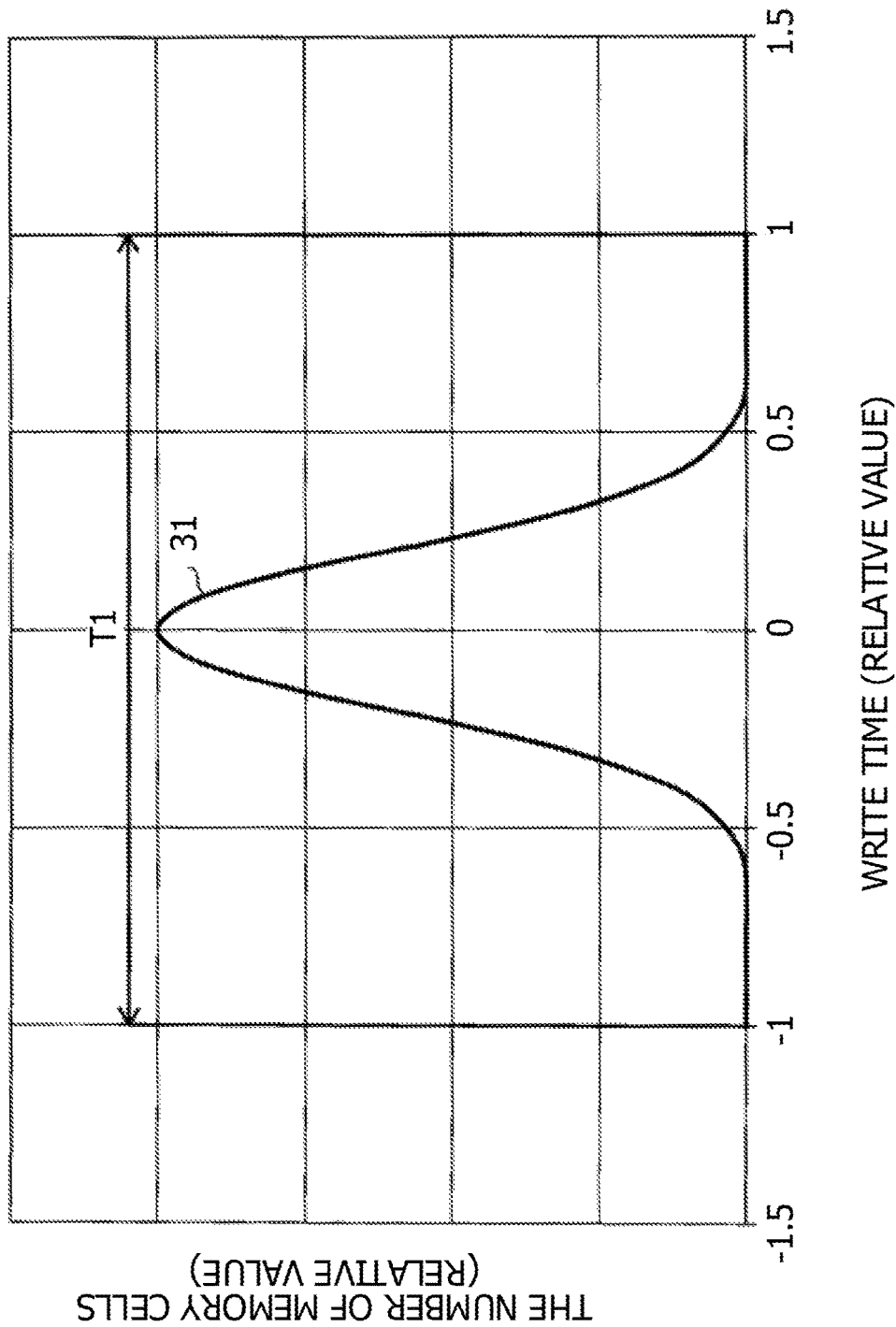
FIG. 2 is a graph illustrating an example of a distribution of write durations.

FIG. 2 is a graph illustrating an example of a distribution of write durations. In FIG. 2, the horizontal axis represents a write duration indicated by a relative value (a value normalized in a standard range), and the vertical axis represents a frequency of each write duration. A distribution profile 31 illustrated in FIG. 2 is an example of a distribution of write durations measured from a memory device of a specific model.

For example, it is possible to create a histogram indicating the frequency of write durations, by executing a write operation on all addresses in the memory device of the model and measuring a time taken for the write operation by using a method that is the same as or similar to the above-described method (that is, the method based on the ready/busy signal). An envelope (a line that couples frequency values of the write durations) in the histogram corresponds to the distribution profile 31. When such a distribution of write durations is pre-created for a memory device of a certain model, it is possible to know the degree of variations in the write durations of the memory device of the model.

A write operation on all addresses may be executed a plurality of times in such a manner that an erase operation is executed on all addresses after a write operation, and then a write operation is executed again. The histogram may be created by accumulating write durations determined through measurement in the plurality of write operations. The histogram may be created by measuring write durations on some addresses, not all addresses.

In order to determine the distribution of write durations, preferably, a plurality of memory devices of the model may be prepared, and the write durations in the plurality of memory devices of the same model may be measured. The histogram may be created by accumulating data about write durations determined through measurement on the plurality of memory devices. Alternatively, the histogram may be created by measuring write durations in only one memory device of the model and using measurement values thereof.

Memory devices of the same model are thought to have substantially the same characteristics, and thus, even when a write duration in only one memory device is measured, it is possible to determine a write-time distribution that has practically no problem. When write durations in a plurality of memory devices of the same model are measured, it is possible to enhance the accuracy thereof compared with a case in which a write duration in one memory device is measured, and it is possible to absorb differences in characteristic variations due to differences in manufacture lots.

When a distribution of write durations in only one memory device is to be measured, the memory device for which the distribution is to be measured is generally a device that differs from a memory device (for example, the flash memory 11 illustrated in FIG. 1) in which actual data is to be stored. However, the memory device for which the distribution is to be measured may be the same as the memory device (for example, the flash memory 11 illustrated in FIG. 1) in which actual data is to be stored. That is, in FIG. 1, the memory controller 10 may pre-execute write processing on all addresses (or some addresses), and write durations may be measured to pre-obtain data (histogram data) indicating the distribution of the write durations. In this case, pre-created data corresponding to the distribution of the write durations and data about the write durations during writing of actual data are data obtained from the identical memory device. However, when the sources of the two pieces of data to be compared with each other are the identical memory device, this is not particularly problematic in order to evaluate variations in memory cells to which actual data is written during writing thereof.

For example, the upper limit and the lower limit of permissible write durations, that is, the borders of a predetermined range of permissible write durations, may be determined based on the distribution of the write durations indicated by the distribution profile 31. In the distribution profile 31 illustrated in FIG. 2, the write durations in all memory cells fit within a time range T1 specified as a standard. This is because a manufacture that manufactures the memory device of the model ensures that the write durations fit within the time range T1 by performing the above-described write time adjustment (writing voltage adjustment), redundancy processing, and so on during shipment of the memory device. When the distribution of the write durations in the memory device of such a model is measured, for example, data like the distribution profile 31 is obtained.

For example, a memory cell with which the upper limit write duration (a threshold) is 0.5 or more and the lower limit write duration (a threshold) is −0.5 or less in the distribution profile 31 has large variations and may be determined to be a defective memory cell. When a memory cell to which actual data is to be written is determined to be defective, the subsequent write operation may be controlled so that the memory cell is not used. In this case, the positions of the thresholds (that is, the positions of the permissible range) may be determined based on both the spread of the distribution profile 31 of a memory device of a model of interest and the use of the memory device.

For example, it is assumed that a memory device of model A has the distribution of write durations which is indicated by the distribution profile 31. When the memory device of model A is used for an application for which a high data retention characteristic is requested, the positions of the thresholds may be set so that the permissible range is set to be small. That is, for example, the upper limit threshold and the lower limit threshold may be set to 0.4 and −0.4, respectively. When the memory device of model A is used for an application for which a high data retention characteristic is not requested, the positions of the thresholds may be set so that the permissible range is set to be relatedly large. For example, the upper limit threshold and the lower limit threshold may be set to 0.9 and −0.9, respectively. Setting the positions of the permissible range according to the use, as described above, allows appropriate quality management on the memory device to be performed depending on the use.

When a memory cell to which actual data is to be written does not fall within the permissible range and is determined to be defective, the subsequent write operation may be controlled so that the memory cell is not used. Alternatively, when the memory device is determined to be defective, the memory device may be replaced with another memory device of the same model.

In the information processing system illustrated in FIG. 1, there are cases in which the number of models of a memory that is usable for the flash memory 11 is not one, and memory devices of a plurality of models are usable for the flash memory 11. In such cases, the distribution of write durations may be measured from each of the different models. For example, when memory devices of models A, B, and C are available for the flash memory 11, a distribution of write durations in model A, a distribution of write durations in model B, and a distribution of write durations in model C may be measured respectively.

The widths of the permissible ranges may be set considering use of the flash memory 11 for respective models A to C, and data indicating the permissible ranges for respective models A to C may be prepared. For example, when it is determined that the memory device of model C is to be used, and the flash memory 11 of model C is installed, write durations of actual data may be evaluated based on data corresponding to the distribution of write durations in model C.

Figure 3:
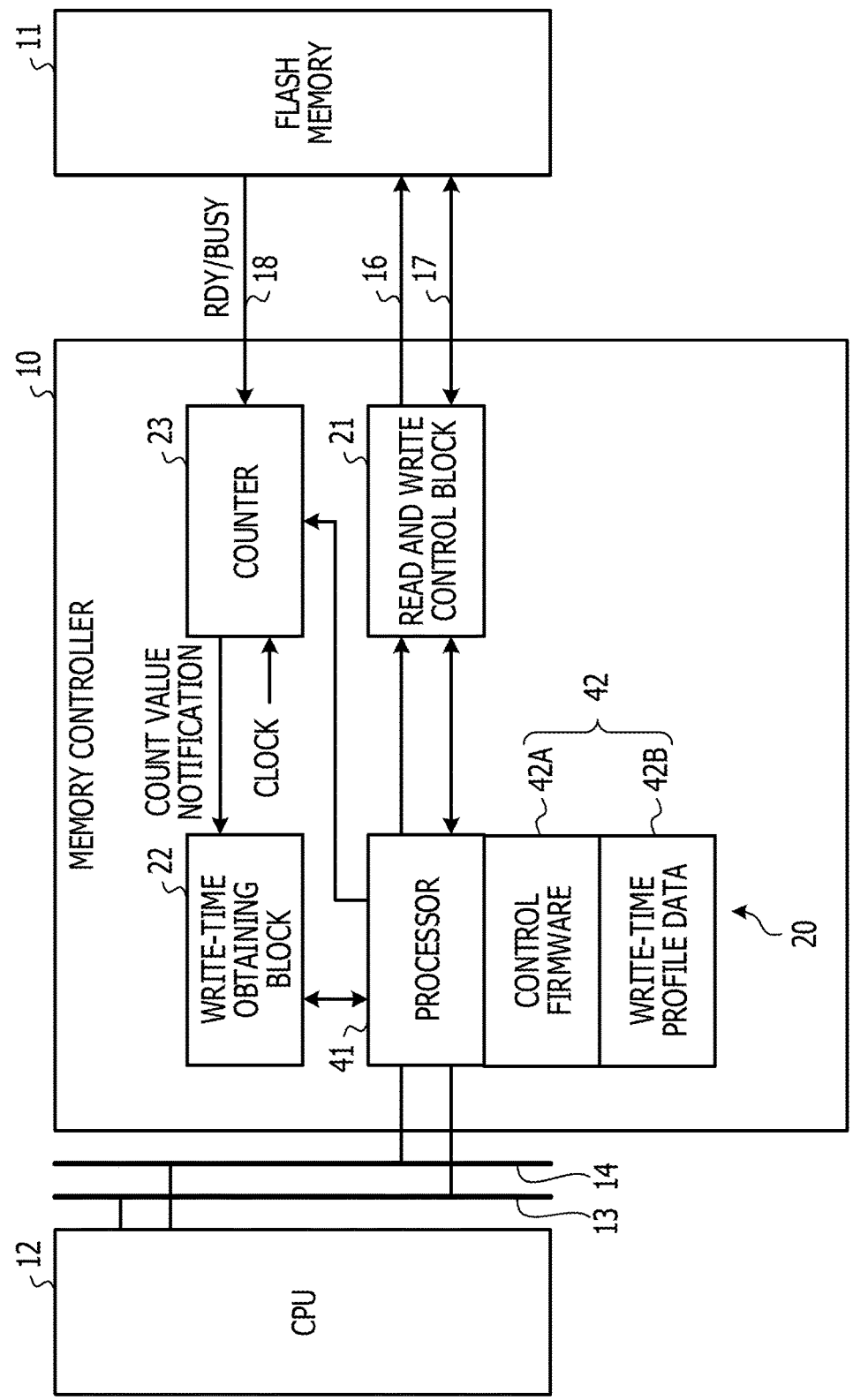
FIG. 3 is a diagram illustrating an example of a configuration in which data corresponding to the distribution of write durations is held in a memory controller, when a controller is implemented as a processor that operates based on firmware.

FIG. 3 is a diagram illustrating an example of a configuration in which data corresponding to the distribution of write durations is held in the memory controller 10, when the controller 20 is implemented as a processor that operates based on firmware. In the configuration illustrated in FIG. 3, the controller 20 includes a processor 41 and a memory area 42.

Control firmware 42A and write-time profile data 42B (that is, the data corresponding to the distribution of write durations) are stored in the memory area 42. By executing the control firmware 42A, the processor 41 executes various types of processing, such as data write processing, data read processing, write-time measurement processing, and memory-cell defect/non-defect determination processing.

The write-time profile data 42B is memory in which data corresponding to the distribution of write durations measured from a memory device of a specific model is stored. By using the write-time obtaining block 22 and the counter 23, the processor 41 measures a write duration taken for writing data to memory cells in the memory device (the flash memory 11) of the specific model. Based on the write-time profile data 42B, the processor 41 determines whether or not any of the memory cells is defective by evaluating a displacement of the measured write duration from the center portion of the distribution.

Figure 4:
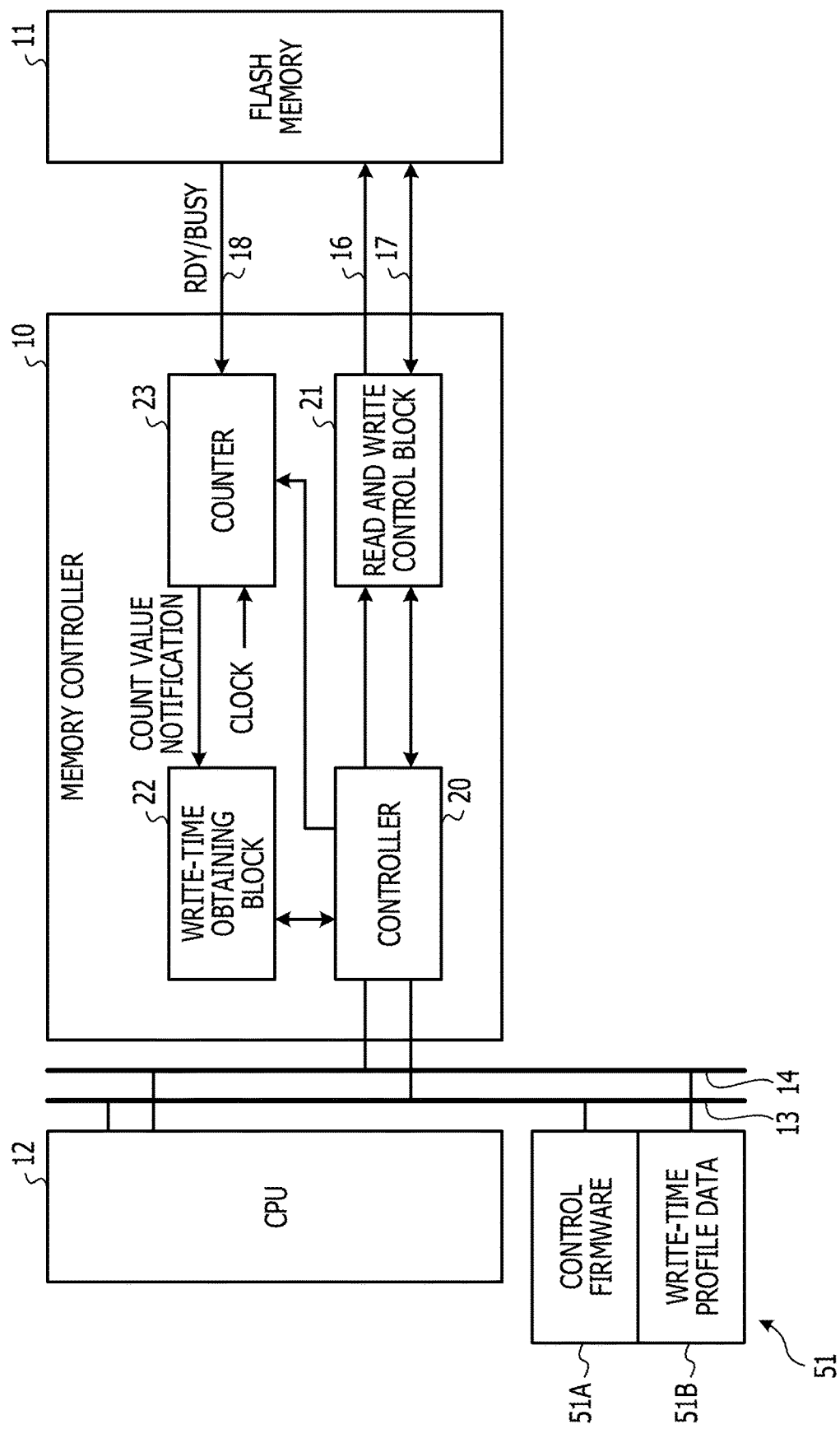
FIG. 4 is a block diagram illustrating an example of a configuration in which the data corresponding to the distribution of write durations is held in a memory device that is accessible from a CPU.

FIG. 4 is a block diagram illustrating an example of a configuration in which the data corresponding to the distribution of write durations is held in a memory device that is accessible from the CPU 12. Specifically, a memory 51 in which the data corresponding to the distribution of write durations is stored is connected to the address and command bus 13 and the data bus 14. In this information processing system, the CPU 12 makes a memory-cell defect/non-defect determination on the flash memory 11. The controller 20 in the memory controller 10 may be entirely implemented by hardware or may be implemented as a processor that operates based on software (firmware).

A control program 51A and a write-time profile data 51B (that is, the above-described data corresponding to the distribution of write durations) are stored in the memory 51. By executing the control program 51A, the CPU 12 executes various types of processing, such as memory-cell defect/non-defect determination processing.

The memory controller 10 controls a write and read operation on the flash memory 11 and also measures a write duration taken for writing data to memory cells in the flash memory 11. The CPU 12 receives, from the memory controller 10, data indicating the measured write duration. The CPU 12 further determines whether or not any of the memory cells is defective by evaluating a displacement of the measured write duration from the center portion of the above-described distribution, based on measurement value data received from the memory controller 10 and the write-time profile data 51B.

Figure 5:
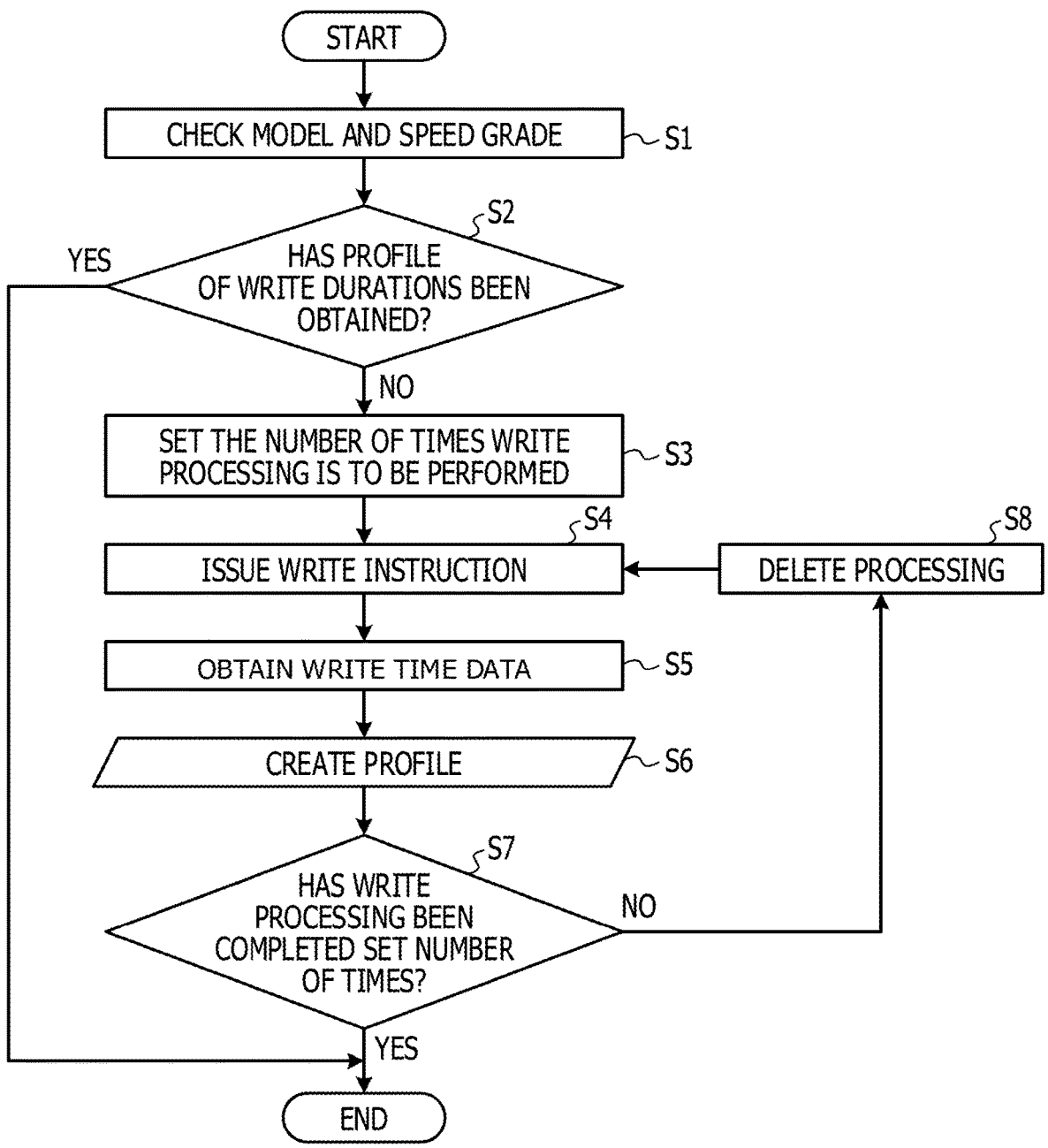
FIG. 5 is a flowchart illustrating an example of a method for obtaining data indicating the distribution of write durations.

FIG. 5 is a flowchart illustrating an example of a method for obtaining data indicating the distribution of write durations. Processing in the flowchart illustrated in FIG. 5 may be executed by, for example, the CPU 12 in the information processing illustrated in FIG. 1 or may be executed by the memory controller 10. Alternatively, the processing in the flowchart illustrated in FIG. 5 may be executed by an information processing system that is entirely different from an information processing system including the flash memory 11.

For example, it is assumed that a set maker sells product X using a memory device of model A, another product Y using a memory device of model B, and yet another product Z using a memory device of model C. In this case, even when different departments respectively sell products X to Y, for example, a department that is mainly responsible for measuring the distributions of write durations in memory devices may measure the distributions of write durations in respective memory devices of models A to C. In this case, an information processing system that is entirely different from an information processing system including a memory device may execute the processing for measuring the distributions.

In FIG. 5 and subsequent figures, the order of executing the steps illustrated in each flowchart is merely an example, and the technical scope intended by the present disclosure is not limited to the illustrated execution order. For example, even when a description is given herein so that step B is executed next to step A, there are cases in which not only may step B be executed next to step A, but also step A may be physically and logically executed next to step B. In such cases, when all results that influence the processing in the corresponding flowchart are the same even when the steps are executed in either of the orders, it is apparent that step A may be executed next to step B in order to realize an object of the technology disclosed herein. Even when a description is given in the present application so that step B is executed next to step A, such a description is not intended to exclude an apparent case as described above from the technical scope intended by the present disclosure, and naturally such an apparent case belongs to the technical scope intended by the present disclosure.

In step S1 in FIG. 5, the model and the speed grade of a memory device to be measured are checked. That is, for example, when it is desired to measure the distribution of write durations for a memory product of model is A and with a speed grade of 50 ns, checking is made as to whether or not the model and the memory grade of a memory device for measurement are the model and the memory grade. The speed grade is an index used when products having different writing speeds are supplied from a manufacturer at different sales prices, even for memory products of the same model. For example, even for memory products of the same model, there are products with different writing speeds, such as products with a speed grade of 50 ns and products with a speed grade of 60 ns.

In step S2, a determination is made as to whether or not a distribution profile of write durations has already been obtained for the memory product of the model and with the speed grade. When the distribution profile has already been obtained, the processing ends. When the distribution profile has not been obtained yet, the process proceeds to step S3.

In step S3, the number of times write processing is to be performed on the memory device is set. Executing the write processing a plurality of times by repeating writing and deleting, as described above, makes it possible to collect more accurate distribution data.

In step S4, the memory controller in the information processing system used for measurement issues a write instruction to the memory device. In step S5, by using, for example, a scheme (as described above) for monitoring a ready/busy signal, the memory controller measures, for example, time durations of writing to memory cells at all addresses.

In step S6, the memory controller, the CPU in the information processing system, or the like creates a distribution profile, based on data of the measurement. That is, a histogram indicating the frequency of the write durations is created, and a distribution profile indicating an envelope (a line that couples the frequency values of the write durations) of the histogram is created. In this case, when an external CPU or the like creates the distribution profile, the memory controller transfers the data of the measurement to the CPU, and then the CPU creates the distribution profile. The histogram may be directly used as the distribution profile for digital data processed in an information processing system. When step S6 in the flowchart is executed for the second or subsequent time, a new distribution profile may be created by cumulatively adding newly obtained frequency data to the distribution profile (the histogram) created up to the previous execution.

In step S7, a determination is made as to whether or not the write processing has been completed the set number of times. When the write processing has been completed the set number of times, the processing in the flowchart in FIG. 5 ends. When the write processing has not been completed the set number of times, the process proceeds to step S8.

In step S8, the memory controller executes erase processing on the memory cells on which writing was performed in step S5. Thereafter, the process returns to step S4, and the processes in the subsequent steps are performed again.

Figure 6:
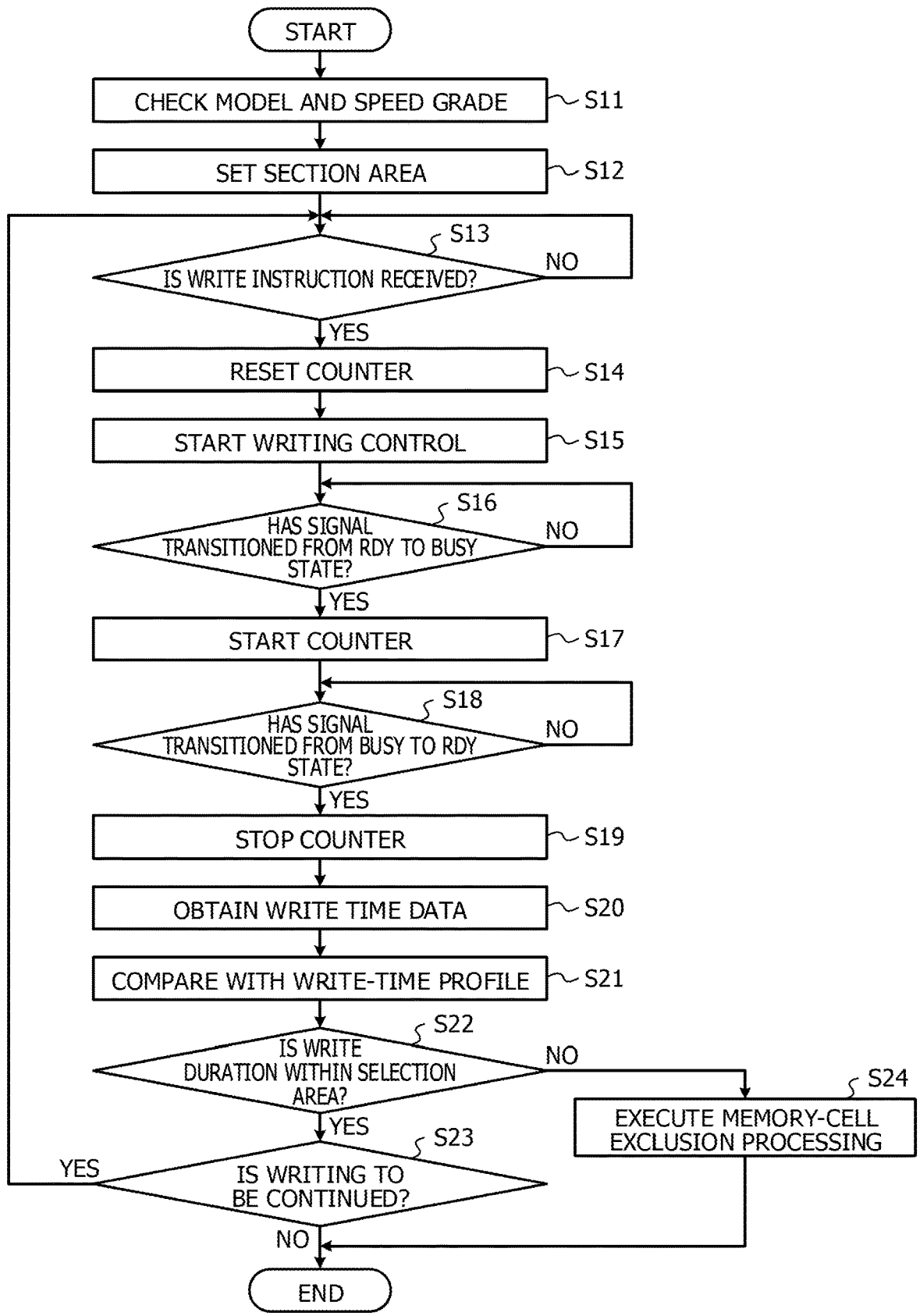
FIG. 6 is a flowchart illustrating an example of processing when the memory controller executes a memory-cell defect/non-defect determination during writing of actual data.

FIG. 6 is a flowchart illustrating an example of processing when the memory controller executes the memory-cell defect/non-defect determination during writing of actual data. For example, the memory controller 10 in FIG. 3 executes the flowchart illustrated in FIG. 6 during write operation of actual data.

In step S11, the memory controller 10 checks the model and the speed grade of a memory device to be measured. Since information of the model and the speed grade have been stored in a status register in the memory device, it is possible to check the model and the speed grade by reading values in the status register.

In step S12, the memory controller 10 sets a selection area. That is, the upper limit and the lower limit of a permissible range of write durations are set. The permissible range may be determined based on both the spread of the distribution profile of the memory device for each model and each speed grade and use of the memory device. Data indicating permissible ranges pre-determined for the respective models and speed grades (that is, data corresponding to the distributions of write durations) may be stored in an internal memory in the memory controller 10. In step S12, a permissible range corresponding to the model and speed grade checked in step S11 may be selected from the permissible ranges in the internal memory, and the selected permissible range (the selection area) may be set so as to be used in subsequent processing.

In step S13, the memory controller 10 receives a write instruction externally. That is, for example, a write instruction, write data, and a write address are received from the CPU 12 illustrated in FIG. 1 or 3. The write data is actual data that is written when the information processing system is used on site.

In step S14, the memory controller 10 resets the internal counter 23. In step S15, the memory controller 10 starts a writing control operation and sends a write instruction to the flash memory 11.

In step S16, the memory controller 10 waits for a ready/busy signal from the flash memory 11 to transition from the ready state to the busy state. When the ready/busy signal transitions from the ready state to the busy state, the memory controller 10 execute step S17 in response to the transition.

In step S17, the counter 23 in the memory controller 10 starts a count operation. The initial value of a count value may be, for example, zero.

In step S18, the memory controller 10 waits for the ready/busy signal from the flash memory 11 to transition from the busy state to the ready state. When the ready/busy signal transitions from the busy state to the ready state, the memory controller 10 executes step S19 in response to the transition.

In step S19, the counter 23 in the memory controller 10 stops the count operation. In step S20, a count value indicating the write duration is stored in the write-time obtaining block 22 in the memory controller 10.

In step S21, the memory controller 10 compares the actual-data write duration obtained this time with a prepared distribution profile of write durations. That is, the memory controller 10 compares data indicating the actual-data write duration obtained this time with the selection area (the permissible range) set in step S12.

In step S22, the memory controller 10 determines whether or not the actual-data write duration is within the selection area (the permissible range). When the actual-data write duration is within the selection area (the permissible range), the process proceeds to step S23 in which the memory controller 10 determines whether or not the write processing is to be continued. When the write processing is to be continued, the process returns to step S13 in which the memory controller 10 performs the processes in the subsequent steps again. When the write processing is to be ended, the memory controller 10 ends the processing in the flowchart in FIG. 6.

When it is determined in step S22 that the write duration is outside the permissible range, the process proceeds to step S24 in which the memory controller 10 executes memory-cell exclusion processing. For example, the memory controller 10 may determine that the memory cell at an address on which the current writing is to be performed is defective and may control a subsequent write operation so that the address of the memory cell is not used. Alternatively, the memory controller 10 may determine that the memory cell at the address on which the current writing is performed is defective and may output a signal indicating that the memory cell is defective. Measures, such as replacing the flash memory 11 with another product, may be taken based on the signal, when the presence of an unusable address is not permitted, for example, as in a case in which the flash memory 11 is used for storing FPGA configuration data. This makes it possible to reject a memory device having a possibility of occurrence of a failure and makes it possible to ensure reliability of finished products over the long run.

In the write operation from steps S14 to S20, the number of memory cells to which write data is to be written is not limited to a particular number. The write data may be written to one memory cell, may be written to eight memory cells at the same time, or may be written to a larger number of memory cells at the same time. As long as the write operation is a single write operation in which writing to a plurality of memory cells is simultaneously performed, regardless of the number of memory cells, the largest one of the write durations in the memory cells may be measured using the ready/busy signal. In this case, however, the memory-cell defect/non-defect determination is performed for each unit of writing.

Figure 7:
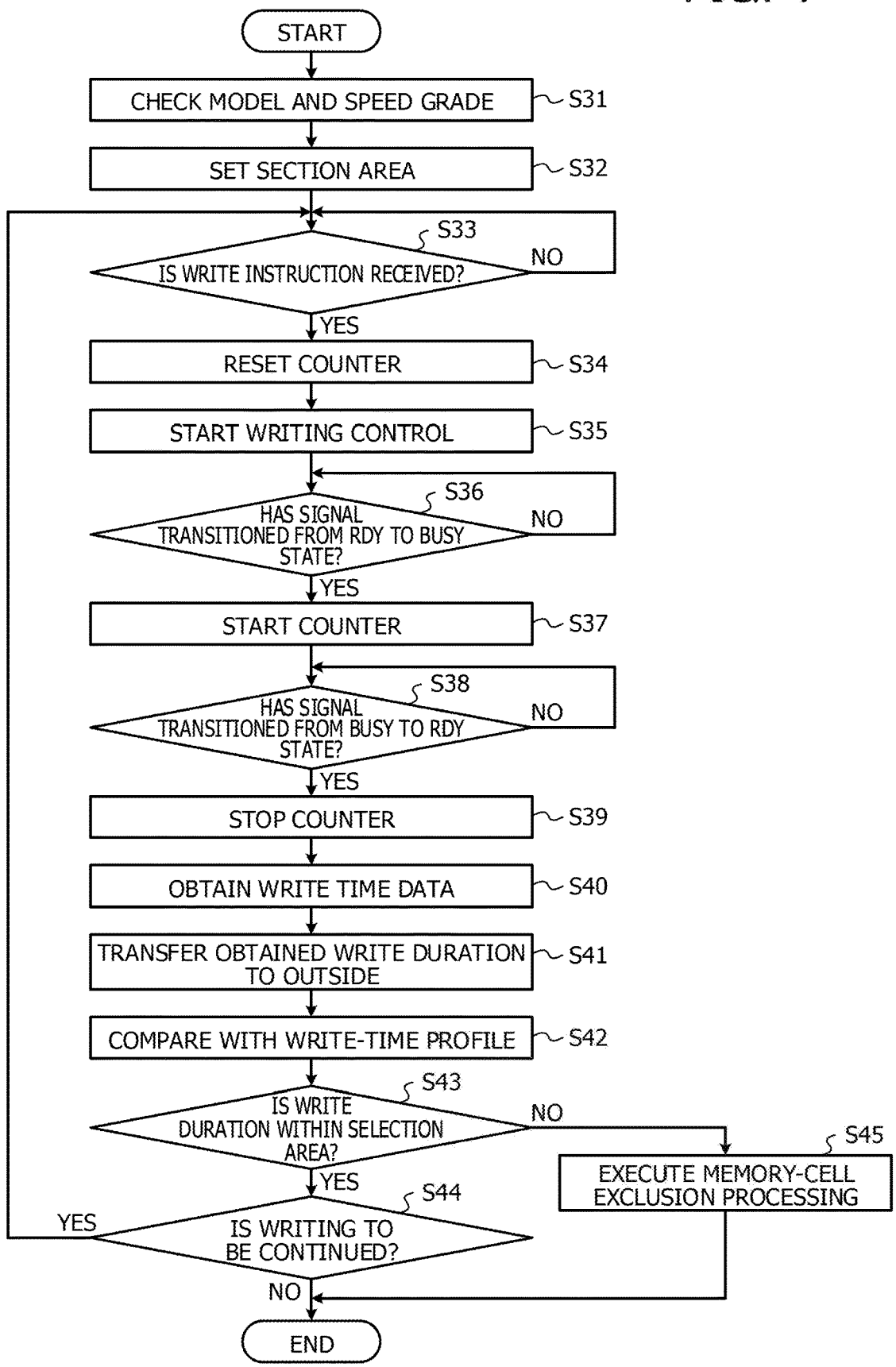
FIG. 7 is a flowchart illustrating an example of processing when an external CPU or the like executes the memory-cell defect/non-defect determination during writing of actual data.

FIG. 7 is a flowchart illustrating an example of processing when an external CPU or the like executes the memory-cell defect/non-defect determination during actual data writing. For example, in the configuration in FIG. 4, during write operation of actual data, one of the CPU 12 and the memory controller 10 executes the steps in the flowchart illustrated in FIG. 7. The processes in the steps in the FIG. 7 are similar to those of the processes in the corresponding steps in FIG. 6, and the processing in FIG. 7 will be described below while paying attention to differences in FIG. 7 from FIG. 6.

In step S31, the CPU 12 checks the model and the speed grade of a memory device to be measured. Since information of the model and the speed grade are stored in a status register in the memory device, the memory controller 10 reads values in the status register and transfers the values to the CPU 12 to thereby allow the CPU 12 to check the model and the speed grade. Alternatively, a user may input information indicating the model and the speed grade so as to allow the CPU 12 to refer to the information.

In step S32, the CPU 12 sets a selection area. In this case, permissible ranges for a plurality of models and a plurality of speed grades may be pre-determined, and data indicating the permissible ranges may be pre-stored in the memory 51. The CPU 12 may select, in the permissible ranges in the memory 51, a permissible range corresponding to the model and speed grade checked in step S31 and may set the selected permissible range (the selection area) so that it is used in subsequent processing.

In step S33, the CPU 12 sends a write instruction to the memory controller 10. The memory controller 10 executes subsequent steps S34 to S40. The details of the processes in steps S34 to S40 are substantially the same as the processes in steps S14 to S20.

In step S41, the memory controller 10 transfers data indicating the actual-data write duration obtained this time to the CPU 12. In step S42, the CPU 12 compares the actual-data write duration obtained this time with a prepared distribution profile of write durations. That is, the CPU 12 compares the data indicating the actual-data write duration obtained this time with the selection area (the permissible range) set in step S32.

In step S43, the CPU 12 determines whether or not the actual-data write duration is within the selection area (the permissible range). When the actual-data write duration is within the selection area (the permissible range), the process proceeds to step S44 in which the CPU 12 determines whether or not the write processing is to be continued. When the write processing is to be continued, the process returns to step S33 in which the CPU 12 performs the processes in the subsequent steps again. When the write processing is to be ended, the CPU 12 ends the processing in the flowchart in FIG. 7.

When it is determined in step S43 that the write duration is outside the permissible range, the process proceeds to step S45 in which the CPU 12 executes memory-cell exclusion processing. For example, the CPU 12 may determine that the memory cell at an address on which the current writing is to be performed is defective and may control a subsequent write operation so that the address of the memory cell is not used. Alternatively, the CPU 12 may determine that the memory cell at the address on which the current writing is performed is defective and may output a signal indicating that the memory cell is defective. Measures, such as replacing the flash memory 11 with another product, may be taken based on the signal, when the presence of an unusable address is not permitted, for example, as in a case in which the flash memory 11 is used for storing FPGA configuration data.

Figure 8:
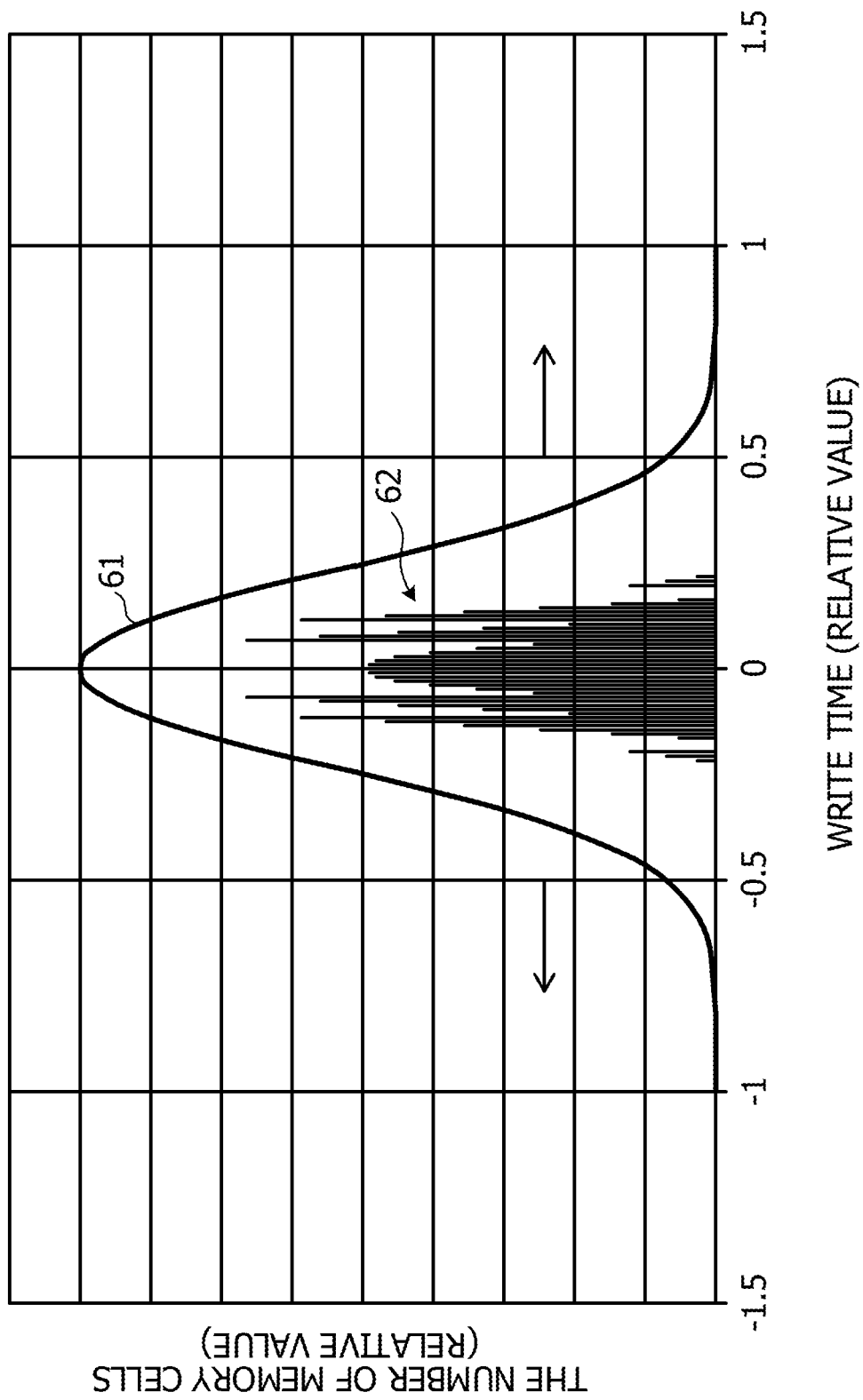
FIG. 8 is a graph illustrating an example of a distribution of write durations measured during writing of actual data.

FIG. 8 is a graph illustrating an example of a distribution of write durations measured during writing of actual data. In FIG. 8, the horizontal axis represents a write duration indicated by a relative value (a value normalized in a standard range), and the vertical axis represents a frequency of each write duration. A distribution profile 61 illustrated in FIG. 8 is an example of a frequency distribution profile indicating a distribution of write durations pre-measured from a memory device of a specific model and with a specific speed grade.

An actual data distribution 62 is a histogram that would be obtained when the write durations measured during writing of actual data to a memory device of the same model and with the same speed grade as those described above are cumulatively recorded, and frequency data for the write durations is created. In the flowcharts in FIGS. 6 and 7, the write durations of actual data are not cumulatively collected. However, there is an advantage in cumulatively collecting the write durations of actual data, as described below, and the actual data distribution 62 illustrated in FIG. 8 is data that would be obtained when the write durations of actual data are cumulatively collected.

In the distribution profile 61, the write durations are within a standard range (−1 to +1). For the distribution profile 61, the upper limit write duration in the permissible range is set to, for example, 0.5 and the lower limit write duration in the permissible range is set to, for example, −0.5, considering the use of the memory device. It is determined that memory cells that do not fall within the permissible range are defective memory cells having large variations.

As illustrated in FIG. 8, the spread width of the actual data distribution 62 is smaller than the spread width of the distribution in the distribution profile 61. In FIG. 8, the histogram of the actual data distribution 62 is illustrated, assuming that the spread width of the actual data distribution 62 is considerably smaller than the spread width of the distribution in the distribution profile 61, for convenience of description. However, the distribution profile 61 and the actual data distribution 62 that are determined for the memory devices of the same model and with the same speed grade are not originally so different from each other.

When the spread of the actual data distribution 62 of a memory device to which actual data is written is smaller than the spread in the distribution profile 61, as illustrated in FIG. 8, it is determined that most of the memory cells of the memory device is not defective. That is, almost no memory cell exists outside the permissible range of −0.5 to +0.5. Accordingly, for example, when the memory device is used for storing FPGA configuration data, the possibility that the memory device is determined to be a defective product, is rejected, and is replaced with another non-defective item/product is low. Also, for example, when the memory device is used for storing log information, almost no unusable address exists in the memory device.

Figure 9:
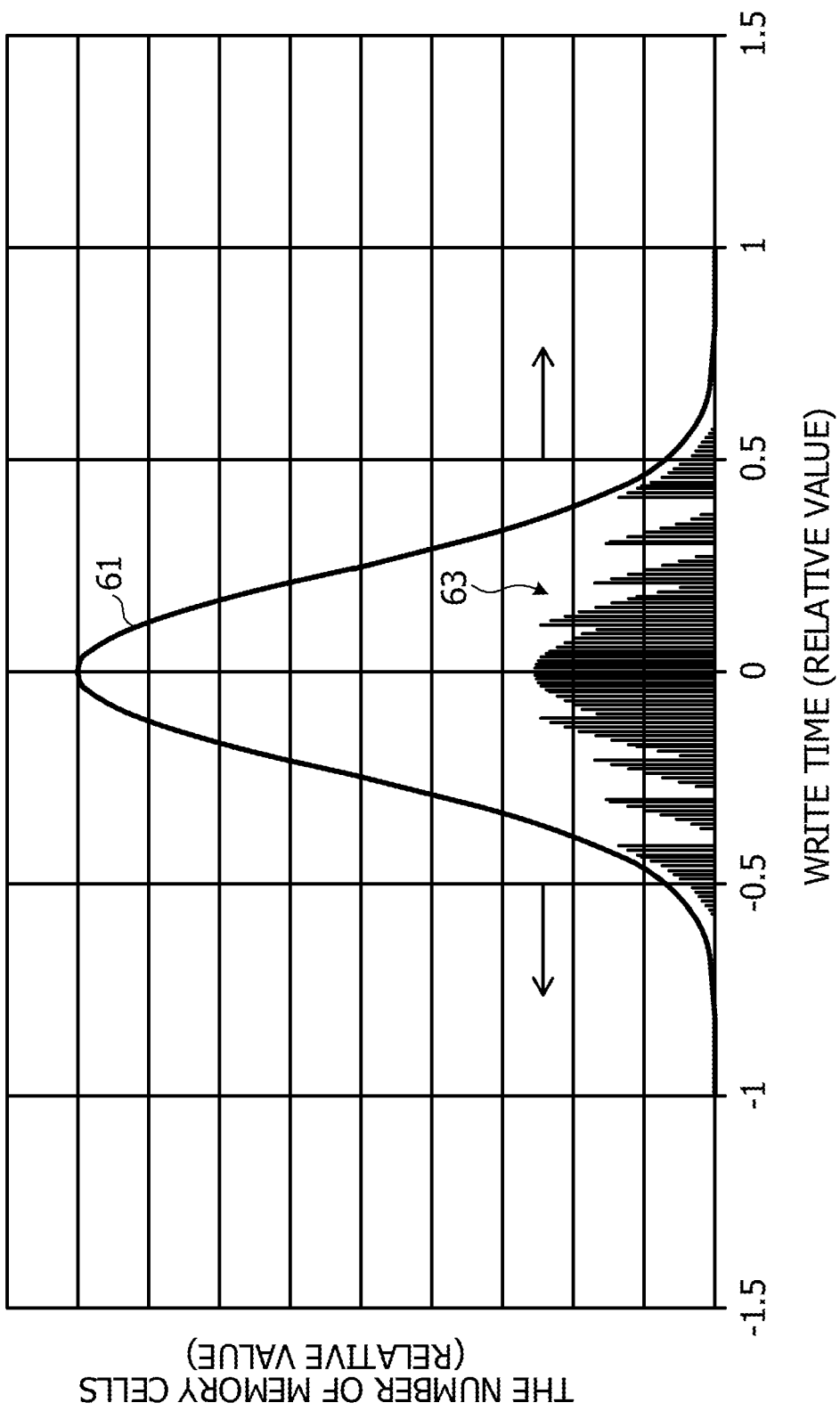
FIG. 9 is a graph illustrating another example of the distribution of write durations measured during writing of actual data.

FIG. 9 is a graph illustrating another example of the distribution of write durations measured during writing of actual data. in FIG. 9, the horizontal axis represents a write duration indicated by a relative value (a value normalized in a standard range), and the vertical axis represents a frequency of each write duration.

A distribution profile 61 is an example of a frequency distribution profile indicating a distribution of write durations pre-measured from a memory device of a specific model and with a specific speed grade. An actual data distribution 63 is a histogram that would be obtained when the write durations measured during writing of actual data to a memory device of the same model and with the same speed grade as those described above are cumulatively recorded, and frequency data for the write durations is created.

In the example illustrated in FIG. 9, the spread width of the actual data distribution 63 is larger than the spread width of the distribution in the distribution profile 61. In this case, a determination result indicating that a relatively large number of memory devices in the memory cell are defective is obtained. That is, a relatively large number of memory cells do not fall within the permissible range of −0.5 to +0.5. Accordingly, for example, when the memory device is used for storing FPGA configuration data, there is a high possibility that the memory device is determined to be a defective product, is rejected, and is replaced with another non-defective item/product. Also, for example, when the memory device is used for storing log information, a relatively large number of addresses are not usable in the memory device.

Figure 10:
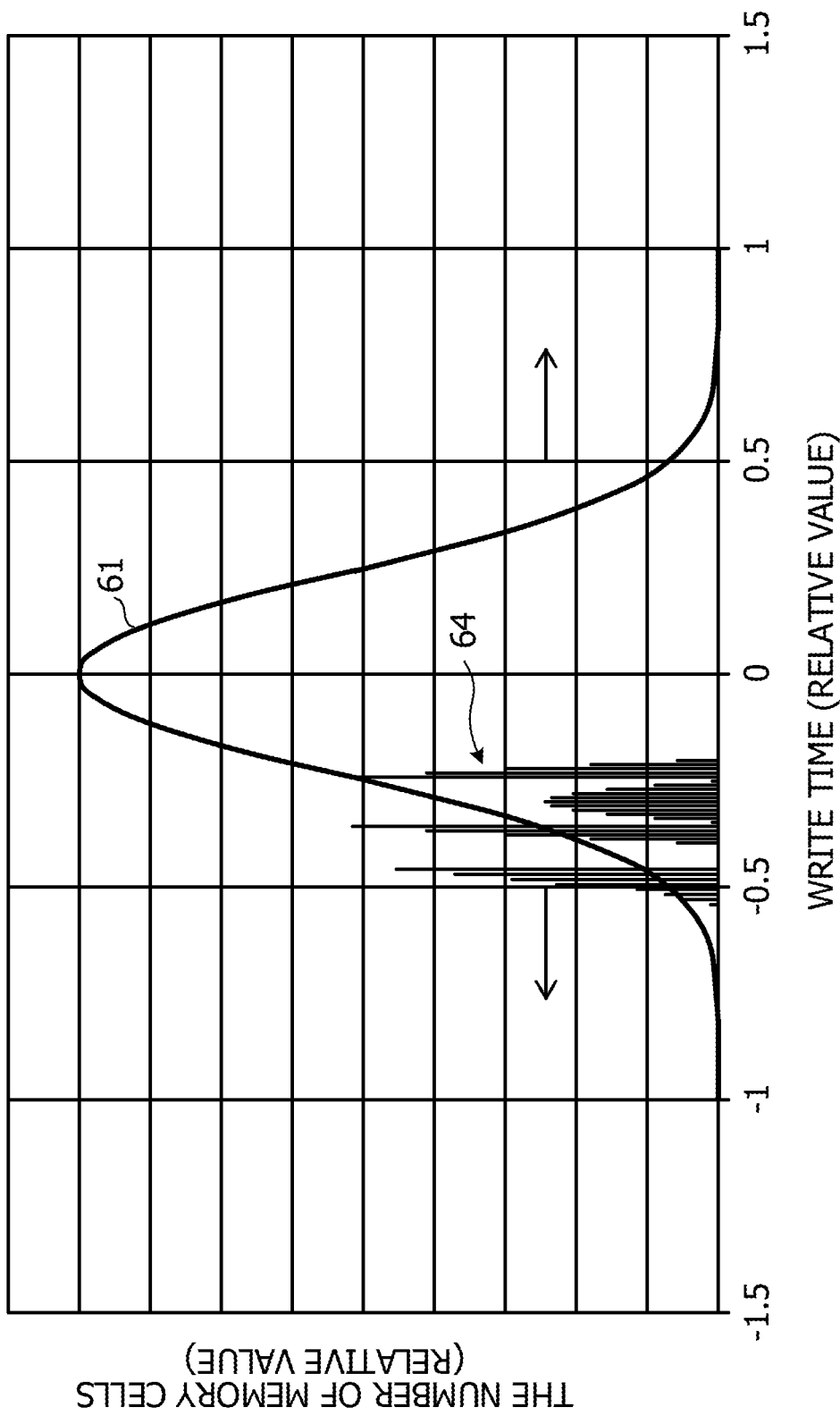
FIG. 10 is a graph illustrating another example of the distribution of write durations measured during writing of actual data.

FIG. 10 is a graph illustrating another example of the distribution of write durations measured during writing of actual data. In FIG. 10, the horizontal axis represents a write duration indicated by a relative value (a value normalized in a standard range), and the vertical axis represents a frequency of each write duration.

A distribution profile 61 is an example of a frequency distribution profile indicating a distribution of write durations pre-measured from a memory device of a specific model and with a specific speed grade. An actual data distribution 64 is a histogram that would be obtained by cumulatively recording the write durations measured during writing of actual data to a memory device of the same model and with the same speed grade as those described above and creating frequency data for the write durations.

In the example illustrated in FIG. 10, the spread width of the actual data distribution 64 is smaller than the spread width of the distribution in the distribution profile 61. However, in the actual data distribution 64, the center value of the write durations is displaced from the center value in the distribution profile 61, and the distribution spreads in the range of about −0.5 to about −0.2. In this case, although the spread width of the actual data distribution 64 is sufficiently small, a determination result indicating that a relatively large number of memory cells in the memory device are defective is obtained. That is, the number of memory cells that fall below −0.5, which is the lower limit of the permissible range, is relatively large. Accordingly, for example, when the memory device is used for storing FPGA configuration data, there is a high possibility that the memory device is determined to be a defective product, is rejected, and is replaced with another non-defective product. Also, for example, when the memory device is used for storing log information, a relatively large number of addresses are not usable in the memory device.

However, a memory cell having a large degree of defectiveness in memory characteristics and having a possibility that there is a problem with a data retention characteristic is thought to have a write duration that is greatly different from a typical write duration. Accordingly, a memory device having a small distribution spread width, as in the actual data distribution 64 illustrated in FIG. 10, may be handled as a good memory device. In particular, when the memory device is used for an application in which the average value of write durations is not particularly limited, there is no problem in handling a memory device having the actual data distribution 64 as a good memory device.

Figure 11:
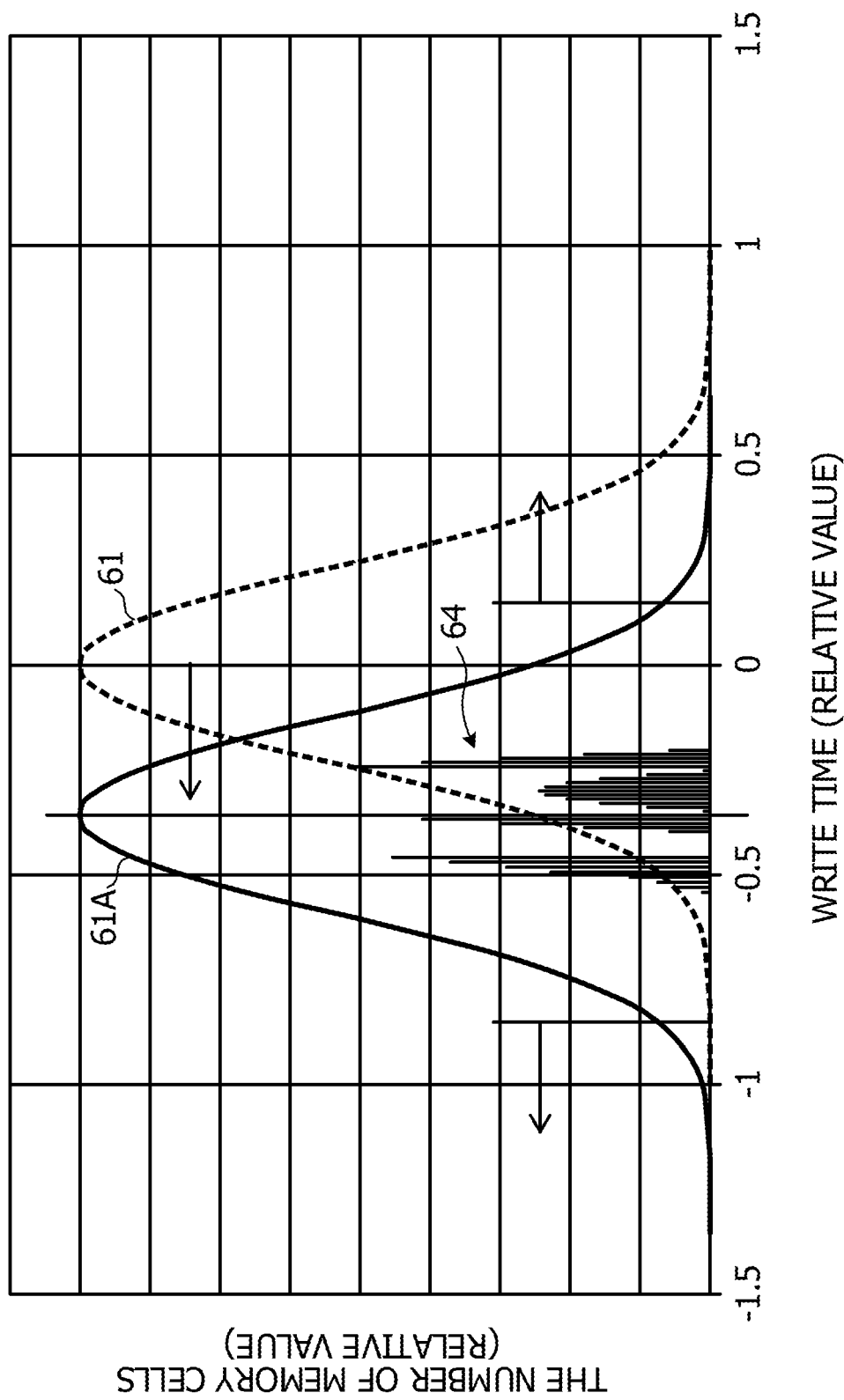
FIG. 11 is a graph illustrating a method for handling, as a non-defective product, a memory device having a small spread width of actual data distribution.

FIG. 11 is a graph illustrating a method for handling, as a non-defective product, a memory device having a small spread width of actual data distribution. In FIG. 11, the horizontal axis represents a write duration indicated by a relative value (a value normalized in a standard range), and the vertical axis represents a frequency of each write duration.

A distribution profile 61 and an actual data distribution 64 illustrated in FIG. 11 are the same as the distribution profile 61 and the actual data distribution 64 illustrated in FIG. 10. For example, when a memory device is used for storing FPGA configuration data, even if some of the memory cells are determined to be defective, a technique in which all data are tentatively written to the memory device, and a distribution of write durations of the actual data is simultaneously recorded is conceivable.

There are cases in which although the spread width of the actual data distribution 64 recorded as described above is sufficiently small, the center value thereof is displaced, as in the case illustrated in FIG. 11, and thus the memory device includes memory cells determined to be defective memory cells. In such cases, a distribution profile 61A obtained by shifting the distribution profile 61, which serves as a base for the defect/non-defect determination, to the left, as illustrated in FIG. 11, may be used as a reference for the determination. That is, for example, a permissible range of −0.5 to +0.5 may be converted into a permissible range of −0.85 to +0.15, and a determination as to whether or not write durations of memory cells are appropriate may be made using the converted permissible range.

The description in the above embodiment has been given of a scheme in which the upper limit threshold and the lower limit threshold of a permissible range are stored as the data corresponding to the distribution of write durations. Such threshold data may have a data format, for example, as illustrated in FIG. 12. In this example of the threshold data, the lower threshold is 95, and the upper threshold is 205. Each of the values of the thresholds is indicated by the number of clocks and corresponds to the number of clocks counted by the counter 23. Accordingly, it is possible to directly compare the number of clocks indicating a write duration measured by the counter 23 with the threshold data. In this case, it is preferable that a clock frequency used for pre-measuring the distribution of write durations and a clock frequency used for measuring write durations of actual data be the same. However, even when the two clock frequencies differ from each other, the number of clocks may be converted, as appropriate.

Not only does threshold data be stored as illustrated in FIG. 12, but also histogram data may be directly stored as the data corresponding to the distribution of write durations. FIG. 13 illustrates an example of such histogram data. This histogram data is a table indicating, with respect to each count value (each number of clocks), the number of memory cells with which a write time corresponding to the count value is taken. In this table, for example, the number of memory cells corresponding to a counter value of 100 is 7. This indicates that the total number of memory cells with which a write time corresponding to a clock count value of 100 is taken is 7.

Histogram data indicating, with respect to each write duration, the number of memory cells with which the write duration is taken, as illustrated in FIG. 13 may be stored, for example, in a memory as the write-time profile data 42B illustrated in FIG. 3 and the write-time profile data 51B illustrated in FIG. 4. In this case, during measurement of a write duration of actual data, data corresponding to the measured write duration may be cumulatively added to the histogram data. Such processing not only makes it possible to absorb differences in characteristic variations which are caused by different manufacture lots, but also makes it possible to absorb fluctuations in product characteristic variations that are likely to fluctuate over the long period of time.

In each of FIGS. 1, 3, and 4, the flash memory is assumed to be a NOR flash memory. Although, in the case of NAND flash memories, controllers ensure validity of stored data with higher reliability than in the case of NOR flash memories, the present technology may be applied to NAND flash memories. Also, the present technology is applicable not only to a flash memory but also to any type of nonvolatile memory that has variations in a write duration and in which a storage element having larger variations is more likely to have a problem in reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A memory controller comprising:
    a memory that stores therein data corresponding to a distribution of write durations measured from a nonvolatile memory device of a specific model; and
    a processor that:
        monitors one of a ready-and-busy signal from a nonvolatile memory device of a same model as the specific model and information indicating whether a write operation is performed in a status register of the nonvolatile memory device;
        starts measuring, when the ready-and-busy signal changes from a ready state to a busy state or the information changes from a first indication that the write operation is not performed to a second indication that the write operation is performed, a write duration taken to write data to a memory cell in the nonvolatile memory device of the same model;
        stops measuring, when the ready-and-busy signal changes from the busy state to the ready state or the information changes from the second indication to the first indication; and
        determines whether or not the memory cell is defective by evaluating, based on the data corresponding to the distribution, a displacement of the measured write duration from a center portion of the distribution.

2. The memory controller according to claim 1, wherein the data corresponding to the distribution indicates borders of a predetermined range of write durations, and the processor determines that the memory cell is defective when the measured write duration exists outside the predetermined range.

3. The memory controller according to claim 2, wherein the predetermined range is a range determined according to use of the nonvolatile memory device of the same model.

4. The memory controller according to claim 1, wherein, upon determining that the memory cell is defective, the processor controls a subsequent write operation so that the memory cell is not used.

5. The memory controller according to claim 1, wherein, upon determining that the memory cell is defective, the processor outputs a signal indicating that the memory cell is defective.

6. The memory controller according to claim 1, wherein the data corresponding to the distribution includes histogram data indicating, with respect to each write duration, the number of memory cells with which the write duration is taken, and the processor cumulatively adds data corresponding to the measurement write duration to the histogram data.

7. An information processing system comprising:
    a memory that stores first data corresponding to a distribution of write durations measured from a nonvolatile memory device of a specific model; a nonvolatile memory device of a same model as the specific model;
    a memory controller that:
        monitors one of a ready-and-busy signal from a nonvolatile memory device of a same model as the specific model and information indicating whether a write operation is performed in a status register of the nonvolatile memory device;
        starts measuring, when the ready-and-busy signal changes from a ready state to a busy state or the information changes from a first indication that the write operation is not performed to a second indication that the write operation is performed, a write duration taken to write data to a memory cell in the nonvolatile memory device of the same model; and
        stops measuring, when the ready-and-busy signal changes from the busy state to the ready state or the information changes from the second indication to the first indication; and
    a processor that receives second data indicating the measured write duration from the memory controller and that determines whether or not the memory cell is defective by evaluating, based on the first and second data, a displacement of the measured write duration from a center portion of the distribution.

8. A nonvolatile-memory defect determination method, comprising:
    referring to, in a memory, data corresponding to a distribution of write durations measured from a nonvolatile memory device of a specific model;
    monitoring one of a ready-and-busy signal from a nonvolatile memory device of a same model as the specific model and information indicating whether a write operation is performed in a status register of the nonvolatile memory device;
    starting measuring, when the ready-and-busy signal changes from a ready state to a busy state or the information changes from a first indication that the write operation is not performed to a second indication that the write operation is performed, a write duration taken to write data to a memory cell in a nonvolatile memory device of a same model as the specific model;

stopping measuring, when the ready-and-busy signal changes from the busy state to the ready state or the information changes from the second indication to the first indication; and determining, by a processor, whether or not the memory cell is defective by evaluating a displacement of the measured write duration from a center portion of the distribution, based on the data corresponding to the distribution.

9. The memory controller according to claim 1, wherein the distribution of the write durations is obtained by setting a number of write operation times and repeating a write operation on the nonvolatile memory device of the specific model, a measurement of the write duration, a making of a histogram of the write duration and an erase operation on the nonvolatile memory device until a repeated time reaches the number of write operation times.

10. The information processing system according to claim 7, wherein the data corresponding to the distribution indicates borders of a predetermined range of write durations, and the processor determines that the memory cell is defective when the measured write duration exists outside the predetermined range.

11. The information processing system according to claim 7, wherein, upon determining that the memory cell is defective, the processor controls a subsequent write operation so that the memory cell is not used.

12. The information processing system according to claim 7, wherein, upon determining that the memory cell is defective, the processor outputs a signal indicating that the memory cell is defective.

13. The information processing system according to claim 7, wherein the data corresponding to the distribution includes histogram data indicating, with respect to each write duration, the number of memory cells with which the write duration is taken, and the processor cumulatively adds data corresponding to the measurement write duration to the histogram data.

14. The information processing system according to claim 7, wherein the distribution of the write durations is obtained by setting a number of write operation times and repeating a write operation on the nonvolatile memory device of the specific model, a measurement of the write duration, a making of a histogram of the write duration and an erase operation on the nonvolatile memory device until a repeated time reaches the number of write operation times.

15. The nonvolatile-memory defect determination method according to claim 8, wherein the data corresponding to the distribution indicates borders of a predetermined range of write durations, and the nonvolatile-memory defect determination method further includes determining that the memory cell is defective when the measured write duration exists outside the predetermined range.

16. The nonvolatile-memory defect determination method according to claim 8, further comprising, upon determining that the memory cell is defective, controlling a subsequent write operation so that the memory cell is not used.

17. The nonvolatile-memory defect determination method according to claim 8, further comprising, upon determining that the memory cell is defective, outputting a signal indicating that the memory cell is defective.

18. The nonvolatile-memory defect determination method according to claim 8, wherein the data corresponding to the distribution includes histogram data indicating, with respect to each write duration, the number of memory cells with which the write duration is taken, and the nonvolatile-memory defect determination method further includes cumulatively adding data corresponding to the measurement write duration to the histogram data.

19. The nonvolatile-memory defect determination method according to claim 8, wherein the distribution of the write durations is obtained by setting a number of write operation times and repeating a write operation on the nonvolatile memory device of the specific model, a measurement of the write duration, a making of a histogram of the write duration and an erase operation on the nonvolatile memory device until a repeated time reaches the number of write operation times.

* * * * *